United States Patent
Sato

[11] Patent Number: 5,907,787
[45] Date of Patent: May 25, 1999

[54] PROCESS FOR FABRICATING MULTILAYER CONNECTION

[75] Inventor: Junichi Sato, Tokyo, Japan

[73] Assignee: Sony Corporation, Tokyo, Japan

[21] Appl. No.: 08/895,324

[22] Filed: Jul. 16, 1997

Related U.S. Application Data

[63] Continuation of application No. 08/601,070, Feb. 12, 1996, abandoned.

[30] Foreign Application Priority Data

Feb. 13, 1995 [JP] Japan ................................ P07-047775

[51] Int. Cl.⁶ ................................................ H01L 21/4763
[52] U.S. Cl. .......................... 438/622; 438/626; 438/627; 438/629; 438/633; 438/643; 438/645; 438/653; 438/669; 438/672
[58] Field of Search ................................ 437/195, 190, 437/192; 438/622, 626, 627, 629, 633, 643, 645, 653, 669, 672

[56] References Cited

U.S. PATENT DOCUMENTS

| | | |
|---|---|---|
| 4,948,459 | 8/1990 | Van Laarhoven et al. ............. 156/643 |
| 5,244,534 | 9/1993 | Yu et al. ................................... 437/195 |
| 5,286,675 | 2/1994 | Chen et al. .............................. 437/192 |
| 5,288,665 | 2/1994 | Nulman ................................... 438/672 |
| 5,527,739 | 6/1996 | Parillo et al. ............................ 437/198 |

*Primary Examiner*—John F. Niebling
*Assistant Examiner*—Lynne A. Gurley
*Attorney, Agent, or Firm*—Hill & Simpson

[57] ABSTRACT

A process for fabricating multilayer connection which provides a flattened surface of an interlayer insulating film and realizes a highly reliable semiconductor device, including: forming an interlayer dielectric film on a lower layer connection and forming an aperture portion in the interlayer dielectric film, the aperture portion being connected to the lower layer connection; forming a metallic film on the entire surface of the interlayer dielectric film inclusive of the aperture portion, thereby filling the aperture portion with a material constituting the metallic film; removing the metallic film from the interlayer dielectric film by etching, except for the metallic film material left over inside the aperture portion; flattening the surface by applying chemical mechanical polishing to the upper surface of the interlayer dielectric film; and forming an upper layer connection on the interlayer dielectric film, the upper layer connection being connected to the metallic film material left over inside the aperture portion.

20 Claims, 5 Drawing Sheets

PROCESS FOR FABRICATING MULTILAYER CONNECTION

This is a continuation, of application Ser. No. 08/601,070, filed Feb. 12, 1996, now abandoned.

BACKGROUND OF THE INVENTION

The present invention relates to a process for forming a multilayer connection in the fabrication process of a semiconductor device, and particularly, to a process for fabricating a multilayer connection for a device having a contact hole or a via hole connecting an upper layer connection and a lower layer connection, where a metal plug is formed by means of blanket metal technology.

With the increasing integrating density of semiconductor devices, the demand for higher density connection patterns requires the patterning technology to implement a still finer and multilayered connection. Accordingly, the technique for forming multilayer connection is increasing its importance in the process for fabricating semiconductor integrated circuits.

In case of forming the multilayer connection above an aluminum connection pattern is formed as a first layer on the portion of an active element such as a transistor formed on a silicon substrate, with an electrode formed therebetween. Another aluminum connection pattern is formed as a second layer on the resulting first layer with an interlayer insulation film such as a dielectric film interposed therebetween. The connection patterns thus provided as the first and the second layers are electrically connected with each other by a metal plug, which is obtained by filling, with a metallic material, an aperture portion formed in the interlayer dielectric film, such as a contact hole or a via hole. In case of a multilayer connection structure having three layers or more, a stacked contact structure is employed so that the contact holes are aligned with each other to establish superposed plugs for simplifying connection patterns and reducing connection resistance.

When an interlayer dielectric film is formed on the lower layer connection, however, steps are formed on the interlayer dielectric film in accordance with the lower layer connection pattern. With increasing fineness and with progressing multilayered structure of the connection, the steps increase their height and become steeper as to impair the process precision of the upper layer connection pattern and the reliability of patterning. In case of an aluminum connection, in particular, not much can be expected at present in improving the coverage of the steps. It is therefore required to increase the planarity of the interlayer dielectric film. The necessity of improving the planarity is important from the viewpoint of the depth of focus degrading with decreasing wavelength in lithography. It can be seen therefore that, from the viewpoint of increasing precision, quality, and reliability of a semiconductor device, the problem of step formation is an important one to be solved.

Another problem is the difficulty of forming a highly reliable metal plug on a fine contact hole or via hole having a high aspect ratio (i.e., elongated holes). Various technologies for forming insulating films, flattening, and metal plugging have been developed heretofore to overcome the problems above. In the process of multilayer connection, in particular, metal plug technology has attracted much attention as a key technology for filling a connection material into fine contact holes and the like. Metal plug technology includes developed techniques such as blanket tungsten (W) technique, selective metal growth technique, high temperature aluminum sputtering, and aluminum reflow process. Among the techniques enumerated above, in particular, blanket metal techniques such as blanket W technique and the like are put into practice for mass production because of their stability despite the process is somewhat complicated. A blanket metal technique comprises forming a metallic film such as a tungsten film and the like on the entire surface of an interlayer dielectric film inclusive of the contact hole, and then removing it by etch-back process and the like while leaving the metal in the contact hole. In this manner, metal plugs can be formed inside the contact holes.

In the blanket metal technique above, steps can be generated due to the depressions that are formed in the contact hole portions. This problem is known as plug loss. Referring to FIGS. 6A to 6C, the problem of plug loss is described in further detail below. In FIG. 6A, a lower layer connection 101 is formed on a substrate (not shown in the figure), and an interlayer dielectric film 102 as an interlayer insulation film is formed thereon. Then, after forming an aperture portion 103 which provides a contact hole in the interlayer dielectric film 102, a glue layer 104 comprising an ohmic layer (e.g., a titanium layer) and a barrier layer (e.g., a titanium nitride (TiN) layer) is formed inside the aperture portion 103 and the interlayer dielectric film 102. A metallic material such as tungsten is applied to the entire surface of the glue layer 104 to provide a blanket metal layer 105. Referring to FIG. 6B, the blanket metal 105 and the glue layer 104 provided on the interlayer dielectric film 102 are removed by etch-back using reactive ion etching process (RIE) and the like to form a metal plug 106 made of the metallic material for the blanket metal layer 105 left over inside the aperture portion 103. To completely remove the layers 104 and 105 from the entire upper surface of the interlayer dielectric film 102 without being affected by the non-uniformity in film thickness and in etching, the etch-back process is performed in a so-called over etching manner by continuing etching for some time even after the interlayer dielectric film 102 is exposed. Thus, the upper surface of the metal plug 106 in the aperture portion 103 is faster etched to become a depression 109 that has a level difference 107 with the upper surface of the interlayer dielectric film 102.

When an upper layer connection 108 is formed on the interlayer dielectric film 102 having the depression 109 as described in the foregoing, as is shown rather exaggerated in FIG. 6C, an indentation 110 is formed in the upper layer connection 108 on the depression 109. Thus, inferior coverage results on the upper layer connection due to the indentation 110, which leads to unfavorable effects such as an increase of the wiring resistance or a decrease in connection reliability. In the aforementioned stacked contact structure, the problem of plug loss is found to be particularly serious as to affect the reliability of the entire device, because the contact hole portions are superposed one after another.

Accordingly, an object of the present invention is to overcome the aforementioned problems of the metal plug technology, and to provide a process for fabricating a multilayer connection which enables a highly reliable device improved in the coverage of the upper layer connection. More specifically, the present invention provides a process for fabricating a multilayer connection by overcoming the problem of forming a depression due to overetching in forming a metal plug, and thereby flattening the surface of the interlayer dielectric film.

SUMMARY OF THE INVENTION

The aforementioned object of the present invention is overcome in one aspect by a process for fabricating multilayer connection of a semiconductor device comprising: forming an interlayer insulation film on a lower layer connection and forming an aperture portion in the interlayer insulation film, the aperture portion being connected to the lower layer connection;

forming a metallic film on the entire surface of the interlayer insulation film inclusive of the aperture portion, thereby filling the aperture portion with a material constituting the metallic film; removing the metallic film from the interlayer insulation film by etching, except for the material constituting the metallic film left over inside the aperture portion; flattening the surface of the interlayer insulation film by applying chemical mechanical polishing to the upper surface of the interlayer insulation film; and forming an upper layer connection on the interlayer insulation film, the upper layer connection being connected to the material constituting the metallic film left over inside the aperture portion.

The object of the present invention is overcome in another aspect by a process for fabricating multilayer connection of a semiconductor device comprising: forming an interlayer insulation film on a lower layer connection and forming an aperture portion in the interlayer insulation film, the aperture portion being connected to the lower layer connection;

forming a glue layer on the inner surface of the aperture portion and on the entire surface of the interlayer insulation film; forming a metallic film on the entire surface of the glue layer inclusive of the aperture portion, thereby filling the aperture portion with a material constituting the metallic film; removing the metallic film and the glue layer from the interlayer insulation film by etching, except for the material constituting the metallic film and the glue layer left over inside the aperture portion; flattening the surface of the interlayer insulation film by applying chemical mechanical polishing to the upper surface of the interlayer insulation film; and forming an upper layer connection on the interlayer insulation film, the upper layer connection being connected to the material constituting the metallic film left over inside the aperture portion.

The object of the present invention is overcome in another aspect by a still another process for fabricating multilayer connection of a semiconductor device comprising: forming an interlayer insulation film on a lower layer connection and forming an aperture portion in the interlayer insulation film, the aperture portion being connected to the lower layer connection; forming a glue layer on the inner surface of the aperture portion and on the entire surface of the interlayer insulation film; forming a metallic film on the entire surface of the glue layer inclusive of the aperture portion, thereby filling the aperture portion with a material constituting the metallic film; removing the metallic film from the interlayer insulation film by etching, except for the material constituting the metallic film and the glue layer left over inside the aperture portion; flattening the surface of the interlayer insulation film by applying chemical mechanical polishing to the upper surface of the glue layer; and forming an upper layer connection on the interlayer insulation film, the upper layer connection being connected to the material constituting the metallic film left over inside the aperture portion.

A preferred embodiment according to the processes of the present invention described above comprises using at least one selected from the group consisting of tungsten, molybdenum, aluminum, and titanium, or an alloy or a silicide thereof for the material constituting the metallic film.

According to the processes of the present invention, an aperture portion is formed in the interlayer insulation film formed on the lower layer connection to provide a via hole (or a contact hole), a glue layer is formed thereafter inside the aperture portion if necessary, and after forming a blanket metal on the entire surface, a metal plug is formed inside the aperture portion by an etch-back process. A level difference, which is appeared on the upper portion of the aperture portion by the etch-back process, can be eliminated by applying chemical mechanical polishing (CMP) after the etch-back process to flatten the upper surface of the interlayer dielectric film.

DETAILED DESCRIPTION OF THE INVENTION

The present invention is described in further detail below referring to non-limiting examples.

Figure 1:
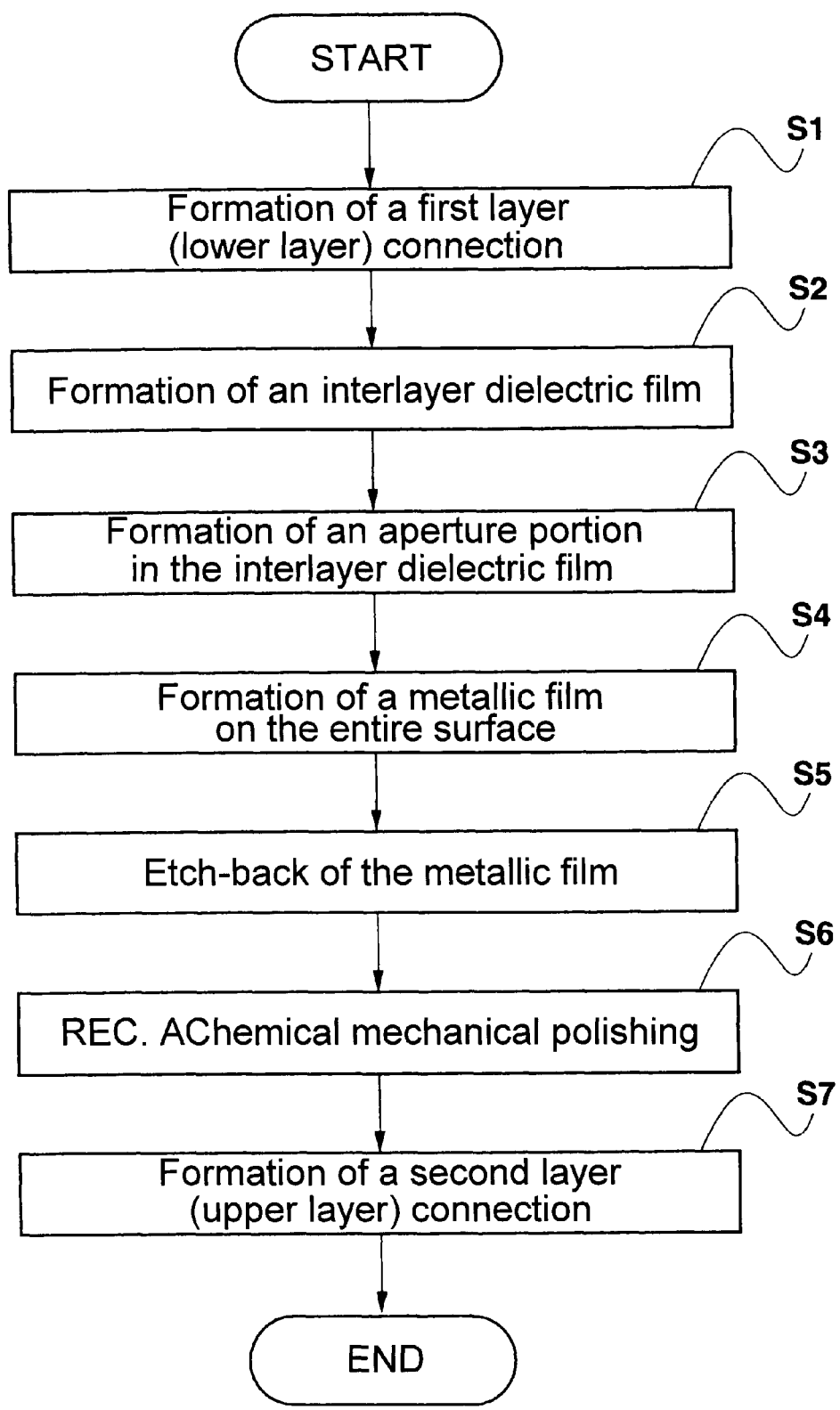
FIG. 1 is a flow chart showing a process for fabricating a multilayer connection according to the present invention.
Figure 2A:
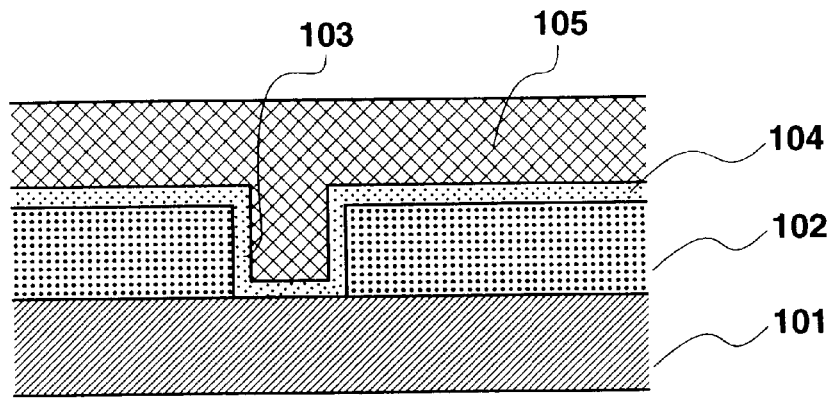
FIGS. 2A to 2C are cross sectional views of a main portion of a stacked structure sequentially showing a process for fabricating a multilayer connection according to an embodiment of the present invention.
Figure 2B:
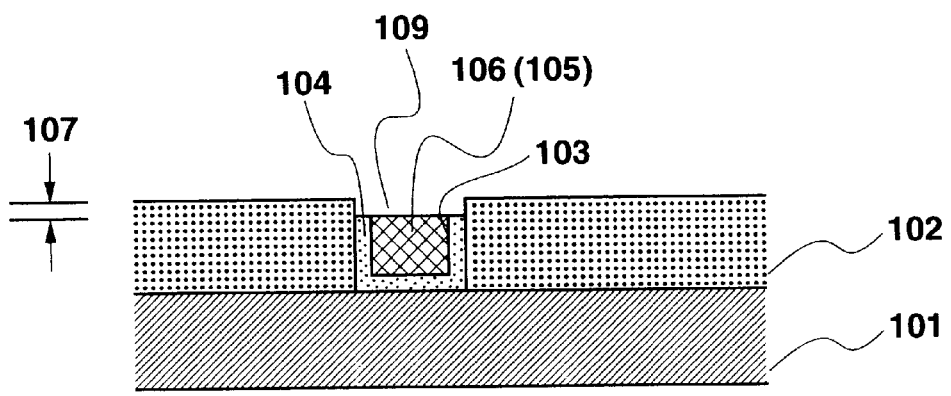
Figure 2C:
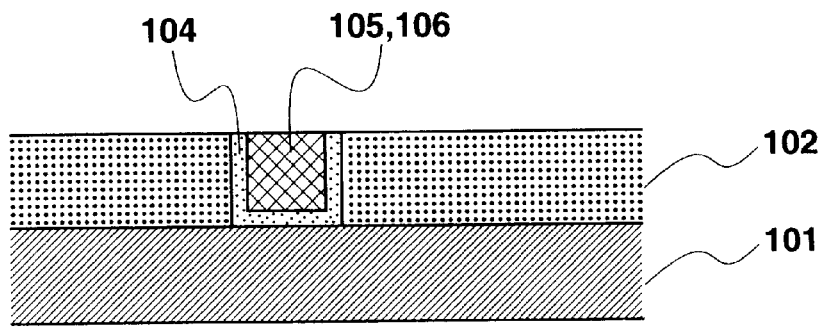

FIG. 1 shows a flow chart showing the process for fabricating a multilayer connection according to an embodiment of the present invention, and FIGS. 2A to 2C each illustrate a cross sectional view of a main portion of a connection structure sequentially obtained in the process. Referring to FIG. 2A, for instance, a lower layer connection 101 of aluminum is deposited and patterned to provide a first layer (lower layer) on a substrate (not shown in the figure) (step S1 shown in FIG. 1). Then, by means of chemical vapor deposition (CVD) and the like, an interlayer dielectric film 102 comprising an insulating material such as silicon oxide is formed on the resulting lower layer connection 101 (step S2). In the subsequent step S3, an aperture portion 103 is formed in the interlayer dielectric film 102 to provide a contact hole, and a glue layer 104 comprising an ohmic layer (e.g., a Ti layer) and a barrier layer (e.g., a TiN layer) is formed on the inner surface of the aperture portion 103 and on the upper surface of the interlayer dielectric film 102 by means of, for instance, sputtering or CVD. A blanket metal layer 105 (e.g., a tungsten film) is formed thereafter by means of low-pressure CVD and the like on the entire surface of the interlayer dielectric film 102 including the inner surface of the aperture portion 103 (step S4). Not only tungsten, but also at least one selected from the group consisting of molybdenum (Mo), aluminum (Al), and titanium (Ti), or an alloy or a silicide thereof can be used for the blanket metal layer 105.

In step S5, a tungsten metal plug 106 is formed by removing the blanket metal layer 105 and the glue layer 104 from the surface of the interlayer dielectric film 102 by means of an etch-back process using RIE and the like, while leaving over the metallic material for the blanket metal layer 105 inside the aperture portion 103. A depression 109 having a level difference 107 with the surface of the interlayer dielectric film 102 is formed on the metal plug 106 by over etching in the etch-back process (FIG. 2B).

In the consecutive step S6, CMP is applied to the interlayer dielectric film 102 from the upper side thereof to eliminate the level difference 107. Thus, the upper surface of the interlayer dielectric film 102 can be flattened as is illustrated in FIG. 2C.

Figure 5:
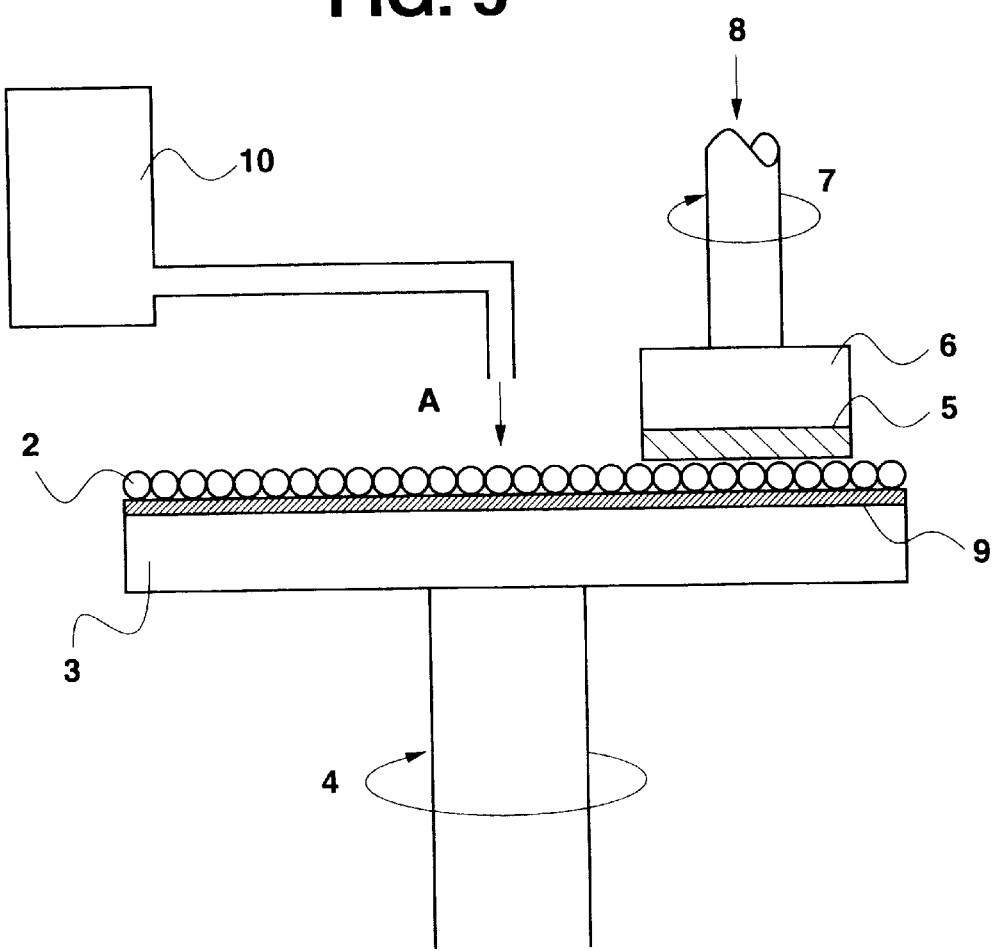
FIG. 5 is a schematic illustration of a main portion of a chemical mechanical polishing machine for use in the process according to the present invention.
Figure 6A:
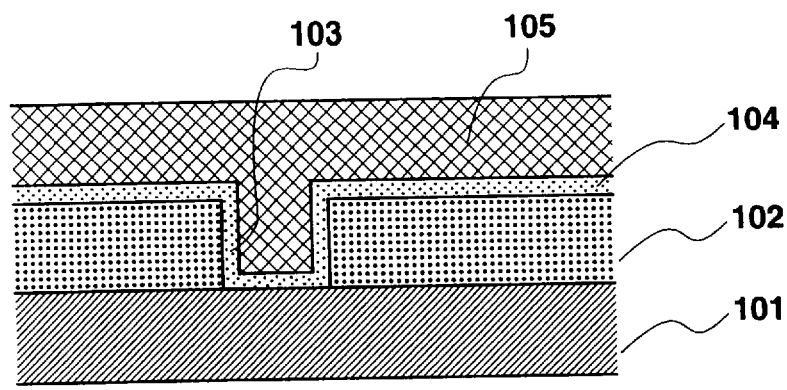
FIGS. 6A to 6C are a cross sectional view of a main portion of a stacked structure sequentially showing a related process for fabricating a multilayer connection.
Figure 6B:
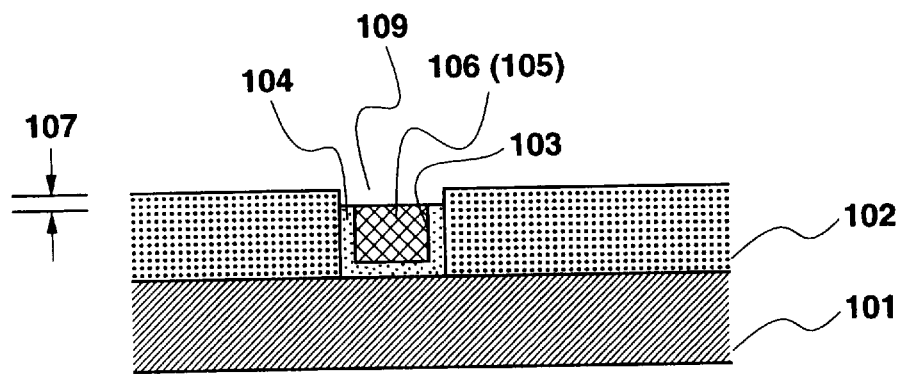
Figure 6C:
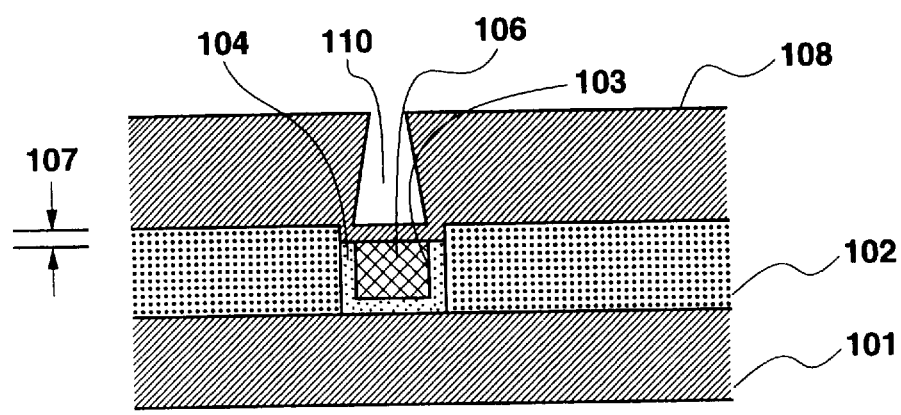

The basic constitution of the polishing machine for use in the CMP above is shown in FIG. 5. A wafer 5, which is to be polished, is set on a carrier 6 and is fixed by a mechanical chuck (not shown in the figure). The wafer 5 that is set on the carrier is disposed opposite to a pad (polisher cloth) 9 provided on the upper surface of a polishing plate 3. A slurry 2 is supplied to the pad 9 from a slurry tank 10 as is illustrated by an arrow A. The slurry 2, which comprises a proper abrasive powder suspended in a liquid, is shown schematically in the figure.

The polishing process for polishing the surface of the wafer is performed by rotating the polishing plate 3 in the direction shown with an arrow 4 and supplying the slurry 2 in the direction indicated with the arrow A, while rotating the carrier 6 in the direction shown with an arrow 7 and pressing the wafer 5 set on the carrier against the pad 9 by applying a predetermined compressive force in the direction shown with an arrow 8. Polishing can be effected under the optimum conditions or under the desired conditions by controlling the rotating speed of the polishing plate 3 or the carrier 6, and the compressive force.

Figure 4:
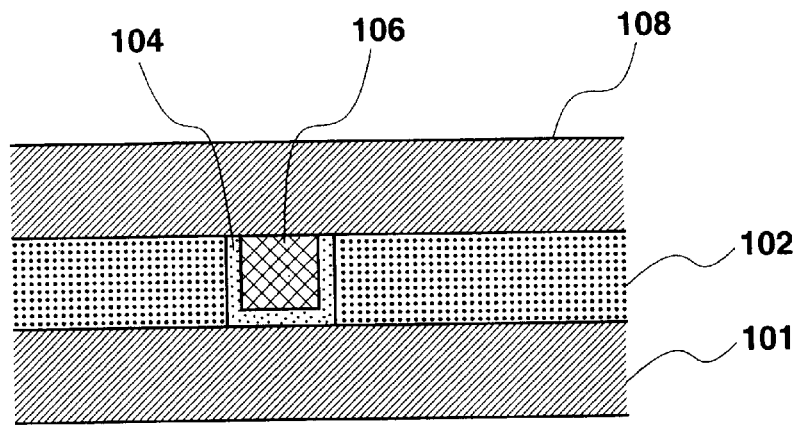
FIG. 4 is a cross sectional view of a main portion of a multilayer connection structure obtained by a process according to the present invention.

Then referring to FIG. 4, an upper layer (second layer) connection 108 is formed on the surface of the interlayer dielectric film 102 flattened by CMP. It can be seen that the level difference 107 shown in FIG. 2B is removed by the polishing treatment, and that a reliable upper layer connection is therefore obtained because of the favorable coverage realized on the upper layer connection 108 (step S7).

Specifically, the CMP above was performed under a basic atmosphere with conditions specified below. Accordingly, a slurry suspended in KOH/water/alcohol was used.

Rotating speed of the polishing plate: 50 (rpm)

Rotating speed of the carrier: 17 (rpm)

Polishing pressure applied: 8 psi

Temperature of the polisher pad: 30–40° C.

Flow rate of the supplied slurry: 225 ml/min

The upper surfaces of the metal plug and the interlayer dielectric film was polished by CMP to obtain a surface free of level difference.

Figure 3A:
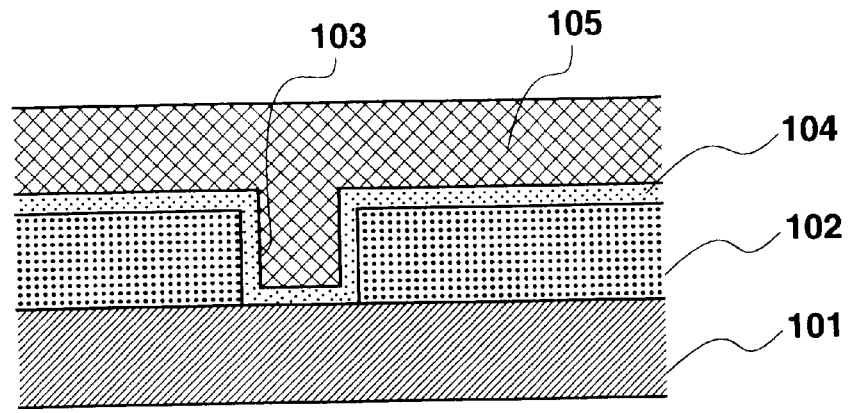
FIGS. 3A to 3C are cross sectional views of a main portion of a stacked structure sequentially showing a process for fabricating a multilayer connection according to another embodiment of the present invention.
Figure 3B:
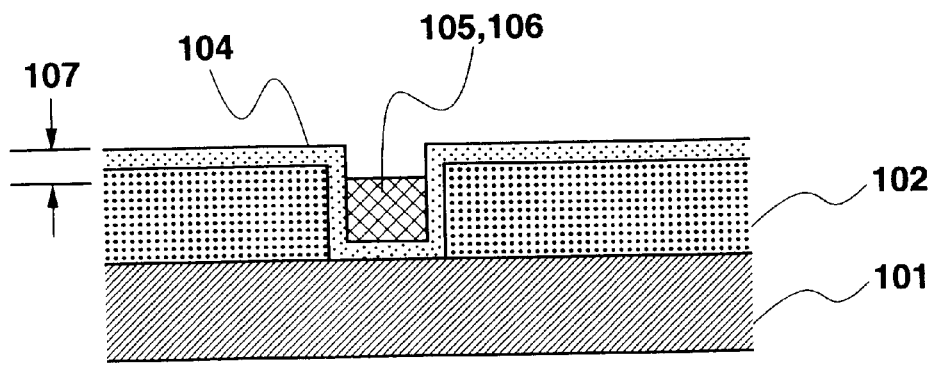
Figure 3C:
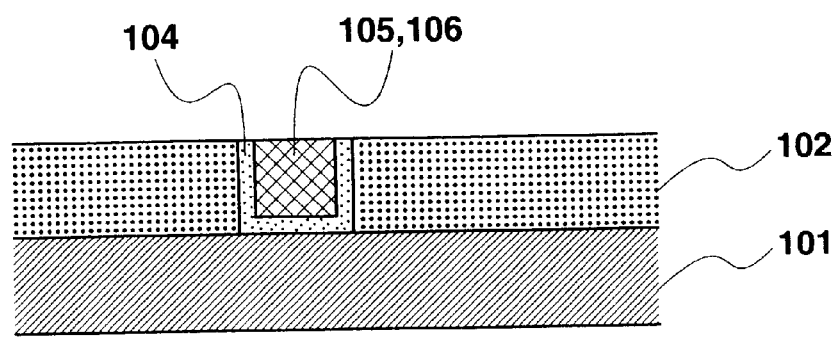

FIGS. 3A to 3C illustrate the cross sectional views of a main portion of a stacked structure sequentially showing another process according to the present invention. The present process differs from that described in accordance with FIGS. 2A to 2C in that the etch-back process in step S5 (as is shown in the flow chart of FIG. 1) of the present case comprises removing the blanket metal layer 105 alone while leaving over the glue layer 104. The etch-back process in the present case can be readily performed by using materials each with a different etching selectivity for the glue layer 104 and the blanket metal layer 105. By performing the etch-back process in this manner with the glue layer 104 left over, a further stable structure can be obtained because trenching of the glue layer can be prevented from occurring during the formation of the metal plug. The other process steps and the effects are the same as those described above with reference to FIGS. 2A to 2C. The polishing conditions of CMP are also the same as those employed in the process described above in accordance to FIGS. 2A to 2C.

CMP of the glue layer can be performed under an acidic atmosphere, and that of the interlayer dielectric film can be performed under a basic atmosphere. Furthermore, the steps in the process flow above can be performed by properly employing the means of a known technology such as lithography, CVD, sputtering, or RIE.

As described in the foregoing, the level difference that is inevitably appeared on the interlayer dielectric film because of the over etching which occurs during the etch-back process of the blanket metal formed over the entire surface of the substrate are removed by CMP. Thus, a uniformly flattened surface can be formed on the interlayer dielectric film, and an improved coverage is realized on the upper layer connection. Hence, a high-quality semiconductor device with highly improved reliability is made feasible because of the reliable connection structure that is obtained with high stability. In particular, remarkable effects can be observed on a multilayer connection of a stacked contact structure, because the metal loss in each of the contact hole portions can be prevented from occurring.

While the invention has been described in detail and with reference to specific embodiments thereof, it will be apparent to one skilled in the art that various changes and modifications can be made therein without departing from the spirit and scope thereof.

What is claimed is:

1. A process for fabricating a multilayer connection of a semiconductor device comprising the steps of:

forming an interlayer insulation film on a lower conductive layer and forming an aperture portion in said interlayer insulation film, said aperture portion being connected to said lower conductive layer;

forming a metallic film on an entire surface of said interlayer insulation film inclusive of said aperture portion, thereby filling the aperture portion with a material comprising said metallic film;

removing said metallic film from said interlayer insulation film by etching, except for said material comprising said metallic film left over inside said aperture portion;

flattening a surface of said interlayer insulation film by applying chemical mechanical polishing to the surface of said interlayer insulation film after said step of removing said metallic film by etching; and thereafter forming an upper layer connection on said interlayer insulation film, said upper layer connection being connected to said material comprising said metallic film left over inside said aperture portion.

2. A process for fabricating multilayer connection of a semiconductor device as claimed in claim 1, wherein said material comprising said metallic film is at least one material selected from the group consisting of tungsten, molybdenum, aluminum, and titanium, or an alloy or a silicide thereof.

3. A process for fabricating multilayer connection of a semiconductor device as claimed in claim 1, wherein a glue layer is formed after forming said aperture portion, said glue layer being formed on an inner surface of said aperture portion and the surface of said interlayer insulation film, and wherein said metallic film is formed after forming said glue layer.

4. A process for fabricating multilayer connection of a semiconductor device as claimed in claim 3,
   wherein said glue layer comprises an ohmic layer and a barrier layer.

5. A process for fabricating multilayer connection of a semiconductor device as claimed in claim 3,
   wherein said glue layer and said metallic film on said interlayer insulating film are removed by etching except for said glue layer and said material comprising said metallic film left over inside said aperture portion after forming said metallic film, and then flattening the surface of said interlayer insulation film by applying chemical mechanical polishing to the upper surface of said interlayer insulation film.

6. A process for fabricating multilayer connection of a semiconductor device as claimed in claim 3,
   wherein said metallic film on said glue layer are removed by etching except for said material comprising said metallic layer left over inside said aperture portion after forming said glue layer and said metallic film, and then flattening the surface of said interlayer insulation film by applying chemical mechanical polishing to said glue layer and the upper surface of said interlayer insulation film.

7. The process for fabricating a multilayer connection of a semiconductor device according to claim 3, wherein only a single step of flattening the surface of the interlayer insulation film by chemical mechanical polishing is performed after the step of removing the metallic film by etching.

8. The process for fabricating a multilayer connection of a semiconductor device according to claim 1, wherein only a single step of flattening the surface of the interlayer insulation film by chemical mechanical polishing is performed after the step of removing the metallic film by etching.

9. A process for fabricating multilayer connection of a semiconductor device comprising:
   forming an interlayer insulation film on a lower conductive layer connection and forming an aperture portion in said interlayer insulation film, said aperture portion being connected to said lower layer connection;
   forming a glue layer on an inner surface of said aperture portion and on the entire surface of said interlayer insulation film;
   forming a metallic film on the entire surface of said glue layer inclusive of said aperture portion, thereby filling the aperture portion with a material constituting said metallic film;
   removing said metallic film and said glue layer from said interlayer insulation film by etching, except for said material constituting said metallic film and said glue layer left over inside said aperture portion;
   flattening the surface of said interlayer insulation film by applying chemical mechanical polishing to the upper surface of said interlayer insulation film after said step of removing said metallic film by etching; and
   forming an upper layer connection on said interlayer insulation film, said upper layer connection being connected to said material constituting said metallic film left over inside said aperture portion.

10. A process for fabricating multilayer connection of a semiconductor device as claimed in claim 9,
    wherein said material comprising said metallic film is at least one material selected from the group consisting of tungsten molybdenum, aluminum, and titanium, or an alloy or a silicide thereof.

11. A process for fabricating multilayer connection of a semiconductor device as claimed in claim 9,
    wherein said glue layer comprises an ohmic layer and a barrier layer.

12. The process for fabricating a multilayer connection of a semiconductor device according to claim 9, wherein only a single step of flattening the surface of the interlayer insulation film by chemical mechanical polishing is performed after the step of removing the metallic film by etching.

13. A process for fabricating multilayer connection of a semiconductor device comprising:
    forming an interlayer insulation film on a lower layer connection and forming an aperture portion in said interlayer insulation film, said aperture portion being connected to said lower layer connection;
    forming a glue layer on the inner surface of said aperture portion and on the entire surface of said interlayer insulation film;
    forming a metallic film on the entire surface of said glue layer inclusive of said aperture portion, thereby filling the aperture portion with a material constituting said metallic film;
    removing said metallic film from said glue layer by etching except for said material constituting said metallic film left over inside said aperture portion;
    flattening the surface of said interlayer insulation film by applying chemical mechanical polishing to said glue layer and the upper surface of said interlayer insulation film; and
    forming an upper layer connection on said interlayer insulation film, said upper layer connection being connected to said material constituting said metallic film left over inside said aperture portion.

14. A process for fabricating multilayer connection of a semiconductor device as claimed in claim 13,
    wherein said material constituting said metallic film is at least one selected from the group consisting of tungsten, molybdenum, aluminum, and titanium, or an alloy or a silicide thereof.

15. A process for fabricating multilayer connection of a semiconductor device as claimed in claim 13,
    wherein said glue layer comprises an ohmic layer and a barrier layer.

16. The process for fabricating a multilayer connection of a semiconductor device according to claim 13, wherein only a single step of flattening the surface of the interlayer insulation film by chemical mechanical polishing is performed after the step of removing the metallic film by etching.

17. A process for fabricating multilayer connection of a semiconductor device comprising:
    forming an interlayer insulation film on a lower layer connection and forming an aperture portion in said interlayer insulation film, said aperture portion being connected to said lower layer connection;
    forming a glue layer on an inner surface of said aperture portion and on the entire surface of said interlayer insulation film;
    forming a metallic film on the entire surface of said glue layer inclusive of said aperture portion, thereby filing the aperture portion with a material constituting said metallic film;

removing said metallic film from said interlayer insulation film by etching, except for said glue layer and said material constituting said metallic film left over inside aperture portion;

flattening the surface of said interlayer insulation film by applying chemical mechanical polishing to the upper surface of said interlayer insulation film after said step of removing said metallic film by etching; and forming an upper layer connection on said interlayer insulation film, said upper layer connection being connected to said material constituting said metallic film left over inside said aperture portion.

18. The process for fabricating a multilayer connection of a semiconductor device according to claim 17, wherein only a single step of flattening the surface of the interlayer insulation film by chemical mechanical polishing is performed after the step of removing the metallic film by etching.

19. A process for fabricating multilayer connection of a semiconductor device as claimed in claim 17, wherein said material comprising said metallic film is at least one material selected from the group consisting of tungsten, molybdenum, aluminum, and titanium, or an alloy or a silicide thereof.

20. A process for fabricating multilayer connection of a semiconductor device as claimed in claim 17, wherein said glue layer comprises an ohmic layer and a barrier layer.

* * * * *